United States Patent
Tomizawa et al.

(10) Patent No.: US 11,769,607 B2
(45) Date of Patent: *Sep. 26, 2023

(54) RESIN COMPOSITION, PREPREG, RESIN SHEET, METAL FOIL-CLAD LAMINATE, AND PRINTED CIRCUIT BOARD

(71) Applicant: MITSUBISHI GAS CHEMICAL COMPANY, INC., Tokyo (JP)

(72) Inventors: Katsuya Tomizawa, Tokyo (JP); Yoichi Takano, Tokyo (JP); Meguru Ito, Tokyo (JP); Eisuke Shiga, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/527,417

(22) Filed: Nov. 16, 2021

(65) Prior Publication Data

US 2022/0076859 A1 Mar. 10, 2022

Related U.S. Application Data

(62) Division of application No. 16/744,625, filed on Jan. 16, 2020, now Pat. No. 11,195,638, which is a division of application No. 15/737,496, filed as application No. PCT/JP2016/069753 on Jul. 4, 2016, now abandoned.

(30) Foreign Application Priority Data

Jul. 6, 2015 (JP) ................................. 2015-135212

(51) Int. Cl.
*H01B 3/44* (2006.01)
*B32B 27/34* (2006.01)
*B32B 5/00* (2006.01)
*C08K 3/00* (2018.01)
*B32B 27/00* (2006.01)
*C08L 101/00* (2006.01)
*C08K 5/54* (2006.01)
*C08K 5/5415* (2006.01)
*C08K 9/06* (2006.01)
*H05K 1/03* (2006.01)
*C08L 79/00* (2006.01)
*C08J 7/043* (2020.01)
*C08J 5/24* (2006.01)
*C08K 5/20* (2006.01)
*C08K 5/3415* (2006.01)
*C08K 5/5419* (2006.01)
*C08L 25/18* (2006.01)
*H01B 3/50* (2006.01)
*C08K 5/05* (2006.01)

(52) U.S. Cl.
CPC ............... *H01B 3/442* (2013.01); *B32B 5/00* (2013.01); *B32B 27/00* (2013.01); *B32B 27/34* (2013.01); *C08J 5/244* (2021.05); *C08J 5/249* (2021.05); *C08J 7/043* (2020.01); *C08K 3/00* (2013.01); *C08K 5/05* (2013.01); *C08K 5/20* (2013.01); *C08K 5/3415* (2013.01); *C08K 5/5415* (2013.01); *C08K 5/5419* (2013.01); *C08K 9/06* (2013.01); *C08L 25/18* (2013.01); *C08L 79/00* (2013.01); *C08L 101/00* (2013.01); *H01B 3/50* (2013.01); *H05K 1/03* (2013.01); *H05K 1/0373* (2013.01); *C08L 2203/20* (2013.01); *H05K 2201/0209* (2013.01)

(58) Field of Classification Search
CPC . C08K 5/541–5425; C08K 9/06; C08L 83/00; C08L 79/00
See application file for complete search history.

(56) References Cited

U.S. PATENT DOCUMENTS

| | | | |
|---|---|---|---|
| 10,011,699 B2 | 7/2018 | Wu et al. | |
| 10,676,579 B2* | 6/2020 | Tomizawa | ............... C08F 2/44 |
| 11,195,638 B2* | 12/2021 | Tomizawa | ............... C08K 5/20 |
| 2005/0175850 A1 | 8/2005 | Koyano et al. | |
| 2006/0084787 A1 | 4/2006 | Sugano et al. | |
| 2006/0136620 A1 | 6/2006 | Chou | |
| 2009/0017316 A1 | 1/2009 | Kato et al. | |
| 2010/0129676 A1 | 5/2010 | Fujimoto et al. | |
| 2010/0178501 A1 | 7/2010 | Masuko et al. | |
| 2011/0133330 A1 | 6/2011 | Bai et al. | |
| 2011/0194261 A1 | 8/2011 | Tanaka et al. | |
| 2013/0220677 A1 | 8/2013 | Amou et al. | |
| 2014/0158413 A1 | 6/2014 | Shanai | |
| 2014/0370771 A1 | 12/2014 | Oka et al. | |
| 2015/0184333 A1 | 7/2015 | Arai et al. | |
| 2015/0267047 A1 | 9/2015 | Takahashi et al. | |

(Continued)

FOREIGN PATENT DOCUMENTS

| | | |
|---|---|---|
| CN | 102149761 A | 8/2011 |
| CN | 104736588 A | 6/2015 |

(Continued)

OTHER PUBLICATIONS

JP 2015017158 A machine translation (Jan. 2015).*
ISR for PCT/JP2016/069753, dated Aug. 16, 2016.
IPRP for PCT/JP2016/069753, dated Jan. 9, 2018.
ISR from PCT/JP2016/069754, dated Sep. 20, 2016 (w/ translation).
IPRP from PCT/JP2016/069754, dated Jan. 9, 2018 (w/ translation).

*Primary Examiner* — Ana L. Woodward
(74) *Attorney, Agent, or Firm* — GREENBLUM & BERNSTEIN, P.L.C.

(57) ABSTRACT

A resin composition comprising a maleimide compound, a cyanate ester compound, a silane compound having a styrene skeleton and a hydrolyzable group or a hydroxy group, and an inorganic filler.

13 Claims, No Drawings

(56) References Cited

U.S. PATENT DOCUMENTS

| | | |
|---|---|---|
| 2015/0344733 A1 | 12/2015 | Tomizawa et al. |
| 2016/0125971 A1 | 5/2016 | Hasebe et al. |
| 2016/0237246 A1 | 8/2016 | Arii et al. |

FOREIGN PATENT DOCUMENTS

| | | |
|---|---|---|
| JP | 56-45948 A | 4/1981 |
| JP | H10-292033 A | 11/1998 |
| JP | 3173332 B2 | 3/2001 |
| JP | 2006-124425 A | 5/2006 |
| JP | 2008-133414 A | 6/2008 |
| JP | 2008-291227 A | 12/2008 |
| JP | 2009-35728 | 2/2009 |
| JP | 2011-178992 A | 9/2011 |
| JP | 2011-530618 A | 12/2011 |
| JP | 2012-197336 A | 10/2012 |
| JP | 2013-1807 A | 1/2013 |
| JP | 2013-127022 A | 6/2013 |
| JP | 2013-139531 A | 7/2013 |
| JP | 2013-216884 A | 10/2013 |
| JP | 2014-185222 A | 10/2014 |
| JP | 2015017158 A * | 1/2015 |
| TW | 200904896 A | 2/2009 |
| WO | 2013/047041 A1 | 4/2013 |
| WO | WO 2014/112464 A1 | 7/2014 |
| WO | 2014/125884 A1 | 8/2014 |
| WO | 2014/196501 A1 | 12/2014 |
| WO | WO 2015/060266 A1 | 4/2015 |

* cited by examiner

RESIN COMPOSITION, PREPREG, RESIN SHEET, METAL FOIL-CLAD LAMINATE, AND PRINTED CIRCUIT BOARD

This application is a Divisional of U.S. application Ser. No. 16/744,625, filed Jan. 16, 2020, which is a Divisional of U.S. application Ser. No. 15/737,496, now abandoned, which is the U.S. National Stage of PCT/JP2016/069753, filed Jul. 4, 2016, which claims priority to JP Application No. 2015-135212, filed Jul. 6, 2015. The disclosure of each of the above-identified documents is incorporated herein by reference in its entirety.

TECHNICAL FIELD

The present invention relates to a resin composition, a prepreg, a resin sheet, a metal foil-clad laminate, and a printed circuit board.

BACKGROUND ART

The high integration or high-density packaging of each component for semiconductor packages has been increasingly accelerated in recent years as semiconductor packages widely used in electronics, communication devices, personal computers, etc. have been more highly functionalized or miniaturized. Along with this, the difference in the coefficient of thermal expansion between a semiconductor device and a printed circuit board for semiconductor plastic packages causes the undesired warpage of semiconductor plastic packages. Various approaches against this problem have been attempted.

One example of the approaches includes reduction in thermal expansion of insulating layers for use in printed circuit boards. This approach is to suppress the warpage by bringing the coefficient of thermal expansion of a printed circuit board closer to the coefficient of thermal expansion of a semiconductor device and is currently being actively addressed (see e.g., Patent Documents 1 to 3).

In addition to the reduction in thermal expansion of printed circuit boards, increase in the rigidity of laminates (high rigidity) or increase in the glass transition temperatures of laminates (high Tg) has been studied as an approach for suppressing the warpage of semiconductor plastic packages (see e.g., Patent Documents 4 and 5).

CITATION LIST

Patent Documents

Patent Document 1: Japanese Patent Application Laid-Open No. 2013-216884
Patent Document 2: Japanese Patent No. 3173332
Patent Document 3: Japanese Patent Application Laid-Open No. 2009-035728
Patent Document 4: Japanese Patent Application Laid-Open No. 2013-001807
Patent Document 5: Japanese Patent Application Laid-Open No. 2011-178992

SUMMARY OF INVENTION

Technical Problem

However, the high integration or high-density packaging of each component for semiconductor packages presents not only the problems mentioned above but other problems to be discussed. For example, in conventional techniques, when a prepreg is laminated with a metal layer such as a copper foil, the laminate is exposed to a chemical solution in an etching step, a desmear step, a plating step, and the like. Therefore, if the laminate has low chemical resistance, the quality or productivity of products is disadvantageously deteriorated. Particularly, in the desmear step, a strongly alkaline washing solution is used for the purpose of removing smears caused by mechanical drill or laser drill. Therefore, if the laminate has insufficient chemical resistance, the inner walls of through-holes or the surface of other resin layers is eluted in addition to smears. As a result, problems become pronounced, such as difficult processing into desired hole diameters or the like, the shortened life of the chemical solution due to the contamination of a step, and the collapse of an anchor formed on insulating layer surface, which leads to reduction in adhesion to a conductor layer (desmear resistance). In addition, the approach based on the high Tg mentioned above causes deterioration in heat resistance after moisture absorption caused by elevated crosslink density. This often becomes a practical problem in the field of electronic materials, which are required to have very high reliability. Also, a method of increasing the ratio of a maleimide compound is suitably used as an approach for the high Tg. In this case, it is difficult to suppress deterioration in chemical resistance derived from the hydrolyzability of a maleimide group. Thus, the preparation of printed circuit boards requires excellent chemical resistance, desmear resistance, and insulation reliability.

The present invention has been made in light of these circumstances, and an object of the present invention is to provide a metal foil-clad laminate and a printed circuit board excellent in chemical resistance, desmear resistance, and insulation reliability, and a resin composition, a prepreg, and a resin sheet that serve as raw materials therefor.

Solution to Problem

The present inventors have conducted diligent studies to achieve the objects and consequently found that a resin composition that serves as a raw material for a printed circuit board contains a plurality of particular components, whereby all of excellent chemical resistance, desmear resistance, and insulation reliability are achieved. On the basis of the finding, the present invention has been completed.

Specifically, the present invention is as described below.

[1]
A resin composition containing a maleimide compound, a silane compound having a styrene skeleton and a hydrolyzable group or a hydroxy group, and an inorganic filler.

[2]
The resin composition according to [1], wherein the resin composition contains, as the silane compound, a compound represented by the following formula (A):

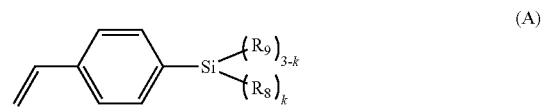

(A)

wherein $R_8$ represents the hydrolyzable group or the hydroxy group; $R_9$ represents a hydrogen atom or an alkyl group having 1 to 3 carbon atoms; when a plurality of Re or $R_9$ are present, the plurality of $R_8$ or $R_9$ are the same as or different from each other; and k represents an integer of 1 to 3.

[3]

The resin composition according to [1] or [2], further containing an alkenyl-substituted nadimide.

[4]

The resin composition according to [3], wherein the resin composition contains, as the alkenyl-substituted nadimide, a compound represented by the following formula (1):

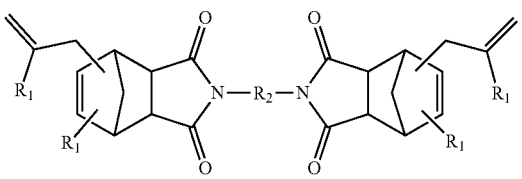
(1)

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following formula (2) or (3):

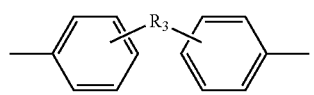
(2)

wherein $R_3$ represents a methylene group, an isopropylidene group, or a substituent represented by CO, O, S, or $SO_2$, and

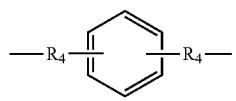
(3)

wherein each $R_4$ independently represents an alkylene group having 1 to 4 carbon atoms, or a cycloalkylene group having 5 to 8 carbon atoms.

[5]

The resin composition according to [3] or [4], wherein the resin composition contains, as the alkenyl-substituted nadimide, a compound represented by the following formula (4) and/or (5):

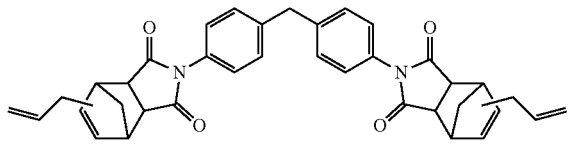
(4)

-continued

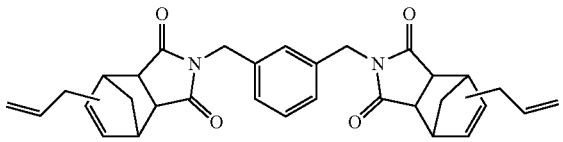
(5)

[6]

The resin composition according to any one of [1] to [5], wherein the resin composition contains, as the maleimide compound, at least one compound selected from the group consisting of bis(4-maleimidophenyl)methane, 2,2-bis(4-(4-maleimidophenoxy)-phenyl)propane, bis(3-ethyl-5-methyl-4-maleimidophenyl)methane, and a maleimide compound represented by the following formula (6):

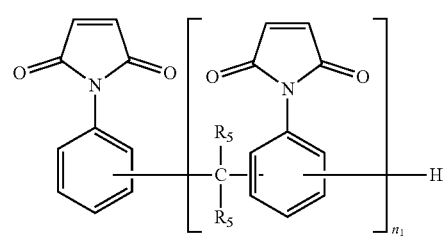
(6)

wherein each $R_5$ independently represents a hydrogen atom or a methyl group, and $n_1$ represents an integer of 1 or larger.

[7]

The resin composition according to any one of [1] to [6], further containing a cyanate ester compound.

[8]

The resin composition according to [7], wherein the resin composition contains, as the cyanate ester compound, a compound represented by the following formula (7) and/or (8):

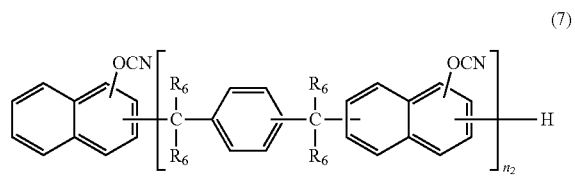
(7)

wherein each $R_6$ independently represents a hydrogen atom or a methyl group, and $n_2$ represents an integer of 1 or larger, and

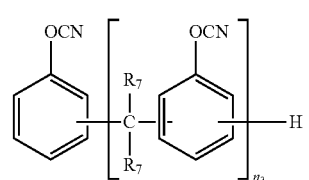
(8)

wherein each $R_7$ independently represents a hydrogen atom or a methyl group, and $n_3$ represents an integer of 1 or larger.

[9]

The resin composition according to any one of [1] to [8], wherein the inorganic filler is surface-treated in advance with the silane compound.

[10]

The resin composition according to any one of [1] to [9], wherein the content of the silane compound is 0.1 to 15 parts by mass based on 100 parts by mass in total of component(s) constituting a resin in the resin composition.

[11]

The resin composition according to any one of [1] to [10], wherein the inorganic filler contains at least one selected from the group consisting of silica, alumina, and aluminum nitride.

[12]

The resin composition according to any one of [1] to [11], wherein the content of the inorganic filler is 100 to 1100 parts by mass based on 100 parts by mass in total of component(s) constituting a resin in the resin composition.

[13]

A prepreg including a base material and a resin composition according to any one of [1] to [12], the base material being impregnated or coated with the resin composition.

[14]

The prepreg according to [13], wherein the base material is at least one material selected from the group consisting of E glass cloth, T glass cloth, S glass cloth, Q glass cloth, and an organic fiber cloth.

[15]

A resin sheet including a support and a resin composition according to any one of [1] to [12], the support being coated with the resin composition.

[16]

A laminate having one or more layers of at least one material selected from the group consisting of a prepreg according to [13] and [14] and a resin sheet according to [15], the laminate including a cured product of a resin composition contained in at least one material selected from the group consisting of the prepreg and the resin sheet.

[17]

A metal foil-clad laminate having at least one material selected from the group consisting of a prepreg according to [13] and [14] and a resin sheet according to [15], and a metal foil disposed on one side or both sides of at least one material selected from the group consisting of the prepreg and the resin sheet, the metal foil-clad laminate including a cured product of a resin composition contained in at least one material selected from the group consisting of the prepreg and the resin sheet.

[18]

A printed circuit board including an insulating layer and a conductor layer formed on a surface of the insulating layer, wherein the insulating layer contains a resin composition according to any one of [1] to [12].

Advantageous Effects of Invention

The present invention can provide a metal foil-clad laminate and a printed circuit board excellent in chemical resistance, desmear resistance, and insulation reliability, and a resin composition, a prepreg, and a resin sheet that serve as raw materials therefor.

DESCRIPTION OF EMBODIMENTS

Hereinafter, an embodiment for carrying out the present invention (hereinafter, also referred to as the "present embodiment") will be described in detail. However, the present invention is not intended to be limited by the present embodiment described below. Various changes or modifications may be made in the present invention without departing from the spirit of the present invention.

The resin composition of the present embodiment contains a maleimide compound, a silane compound having a styrene skeleton and a hydrolyzable group or a hydroxy group (hereinafter, also referred to as a "styryl silane compound"), and an inorganic filler. In this resin composition, which contains the maleimide compound and the styryl silane compound, the styryl silane compound bonded at its hydrolyzable group or hydroxy group to the inorganic filler is also bonded at its styrene skeleton to the maleimide compound to thereby enhance the adhesion between the inorganic filler and the maleimide compound. Particularly, the bonding of the styryl silane compound to the maleimide compound is probably caused by Diels-Alder addition reaction and is presumed to be a stronger bond because a ladder-shaped crosslinking point is thereby formed. As a result, the resistance of the resin composition of the present embodiment to chemical treatment and desmear treatment is enhanced. Thus, a metal foil-clad laminate and a printed circuit board excellent in chemical resistance and desmear resistance can be obtained. Furthermore, in addition to the high adhesion between the inorganic filler and the maleimide compound, the styryl silane compound usually has no polar group and thus has high hydrophobicity. For these reasons, a metal foil-clad laminate and a printed circuit board obtained with the resin composition of the present embodiment as a raw material are excellent in insulation reliability. However, possible factors are not limited to those described above.

The maleimide compound used in the present embodiment is not particularly limited as long as the compound has one or more maleimide groups in the molecule. Specific examples thereof include N-phenylmaleimide, N-hydroxyphenylmaleimide, bis(4-maleimidophenyl)methane, 2,2-bis(4-(4-maleimidophenoxy)-phenyl)propane, bis(3,5-dimethyl-4-maleimidophenyl)methane, bis(3-ethyl-5-methyl-4-maleimidophenyl)methane, bis(3,5-diethyl-4-maleimidophenyl)methane, a maleimide compound represented by the formula (6) set forth below, prepolymers of these maleimide compounds, and prepolymers of the maleimide compounds and amine compounds. These compounds can be used singly or in a form of a suitable mixture of two or more thereof.

Among them, bis(4-maleimidophenyl)methane, 2,2-bis{4-(4-maleimidophenoxy)-phenyl}propane, bis(3-ethyl-5-methyl-4-maleimidophenyl)methane, or a maleimide compound represented by the following formula (6) is preferred, and a maleimide compound represented by the following formula (6) is particularly preferred. When the resin composition contains such a maleimide compound, the resulting cured product tends to have better heat resistance and rate of elastic modulus maintenance.

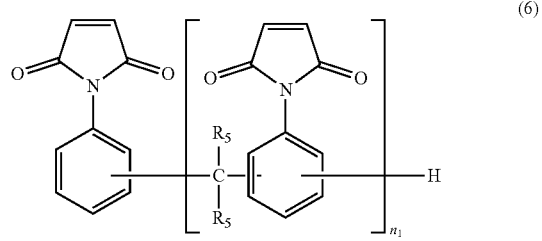

(6)

In the formula (6), each $R_5$ independently represents a hydrogen atom or a methyl group and is particularly preferably a hydrogen atom. In the formula, $n_1$ represents an integer of 1 or larger. The upper limit of $n_1$ is preferably 10, more preferably 7.

In the resin composition of the present embodiment, the content of the maleimide compound is preferably determined according to the ratio of the number of functional group between the number of alkenyl groups (α) as a functional group in an optionally contained alkenyl-substituted nadimide and the number of maleimide groups (β) in the maleimide compound ([β/α]) as mentioned later. The content of the maleimide compound is preferably 15 to 70 parts by mass, more preferably 20 to 45 parts by mass, based on 100 parts by mass in total of component(s) constituting a resin (also including components that form resins by polymerization; the same holds true for the description below) in the resin composition. The content of the maleimide compound falls within such a range, whereby the resulting resin composition can be excellent in moldability even when filled with an inorganic filler, and be excellent in curability and elastic modulus under heat such as flexural modulus at, for example, 250° C. during curing or flexural modulus at a solder reflow temperature, and a printed circuit board or the like excellent in desmear resistance and chemical resistance can be obtained.

The resin composition of the present embodiment contains a styryl silane compound in order to enhance the adhesion between the maleimide compound and the inorganic filler. The styryl silane compound is not particularly limited as long as the styryl silane compound is a silane compound having a styrene skeleton and a hydrolyzable group or a hydroxy group. The styryl silane compound may be any compound for use as a silane coupling agent having a styrene skeleton and a hydrolyzable group or a hydroxy group (so-called styryl silane coupling agent). The styryl silane compound preferably includes a compound represented by the following formula (A), in view of more effectively and reliably exhibiting the function effects of the present invention.

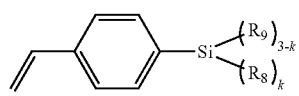

(A)

In the formula (A), $R_8$ represents the hydrolyzable group or the hydroxy group; $R_9$ represents a hydrogen atom or an alkyl group having 1 to 3 carbon atoms; when a plurality of $R_8$ or $R_9$ are present, the plurality of $R_8$ or $R_9$ are the same as or different from each other; and k represents an integer of 1 to 3. Examples of the hydrolyzable group include: alkoxy groups such as a methoxy group, an ethoxy group, and a propoxy group; and halogen atoms such as a chlorine atom and an iodine atom (the same holds true for the description below).

Specific examples of the styryl silane compound include p-styryltrimethoxysilane, p-styryltriethoxysilane, p-styrylmethyldimethoxysilane, p-styrylmethyldiethoxysilane, and N-(vinylbenzyl)-2-aminoethyl-3-aminopropyltrimethoxysilane hydrochloride. Among them, p-styryltrimethoxysilane or p-styryltriethoxysilane is preferred, and p-styryltrimethoxysilane is more preferred. Examples of commercially available products include KBM-575 and KBM-1403 (both are the names of products manufactured by Shin-Etsu Chemical Co., Ltd.). These styryl silane compounds are used singly or in combinations of two or more thereof.

In the resin composition of the present embodiment, the content of the styryl silane compound is not particularly limited and is preferably 0.1 to 15 parts by mass, more preferably 0.1 to 10 parts by mass, particularly preferably 0.5 to 5 parts by mass, based on 100 parts by mass in total of component(s) constituting a resin in the resin composition. The content of the styryl silane compound within the range described above leads to further improvement in desmear resistance, chemical resistance, and insulation reliability, while it also can further suppress reduction in moldability.

The resin composition of the present embodiment contains an inorganic filler. The inorganic filler contributes to reduction in the thermal expansion of a printed circuit board and improvement in elastic modulus and the coefficient of thermal conductivity. The inorganic filler is not particularly limited as long as the inorganic filler has insulating properties. Examples thereof include silicas (e.g., natural silica, fused silica, amorphous silica, and hollow silica), alumina, aluminum nitride, boron nitride, boehmite, molybdenum oxide, titanium oxide, silicone rubber, hybrid silicone powder, zinc borate, zinc stannate, clay, kaolin, talc, fired clay, fired kaolin, fired talc, mica, short glass fiber (fine glass powders such as E glass and D glass), hollow glass, and spherical glass. These inorganic fillers are used singly or in combinations of two or more thereof. Among them, silica is preferred in view of achieving lower thermal expansion, and alumina or aluminum nitride is preferred in view of achieving higher thermal conductivity. The inorganic filler may be surface-treated in advance with the styryl silane compound. A method for the surface treatment is not particularly limited. Examples thereof include direct treatment methods such as a dry treatment method and a treatment method using slurry (wet method). A wet method is preferred in view of uniform treatment. Alternatively, the inorganic filler may be a commercially available surface-treated inorganic filler.

In the resin composition of the present embodiment, the content of the inorganic filler is not particularly limited and is preferably 100 to 1100 parts by mass, more preferably 100 to 700 parts by mass, based on 100 parts by mass in total of component(s) constituting a resin in the resin composition. When the content of the inorganic filler falls within the range described above, characteristics unique to the inorganic filler, such as low thermal expansion, high elasticity, and the coefficient of thermal conductivity are more favorably exhibited, while reduction in moldability can be further suppressed.

The average particle size (D50) of the inorganic filler is not particularly limited and is preferably 0.2 to 10 μm, more preferably 2 to 5 μm, because finer wiring can be formed thereby. The particle shape of the inorganic filler is not particularly limited and is preferably a spherical or substantially spherical shape in view of moldability. In this context, D50 is a median size and is a size that splits the measured particle size distribution of a powder such that the mass of half of the particles being larger is equal to the mass of half of the particles being smaller. D50 is generally measured by a wet laser diffraction/scattering method.

The resin composition of the present embodiment preferably contains an alkenyl-substituted nadimide in view of more effectively and reliably exhibiting the function effects of the present invention. The alkenyl-substituted nadimide is not particularly limited as long as the compound has one or more alkenyl-substituted nadimide groups in the molecule.

Specific examples thereof include a compound represented by the following formula (1):

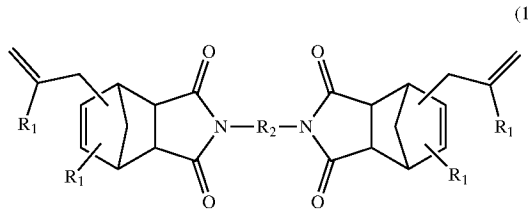

In the formula (1), each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following formula (2) or (3):

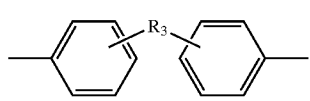

In the formula (2), $R_3$ represents a methylene group, an isopropylidene group, or a substituent represented by CO, O, S, or $SO_2$.

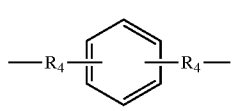

In the formula (3), each $R_4$ is independently selected and represents an alkylene group having 1 to 4 carbon atoms, or a cycloalkylene group having 5 to 8 carbon atoms.

A commercially available product can also be used as the alkenyl-substituted nadimide represented by the formula (1). Examples of the commercially available product include, but are not particularly limited to, a compound represented by the formula (4) set forth below (BANI-M (manufactured by Maruzen Petrochemical Co., Ltd.)), and a compound represented by the formula (5) set forth below (BANI-X (manufactured by Maruzen Petrochemical Co., Ltd.)). These compounds may be used singly or in combinations of two or more thereof.

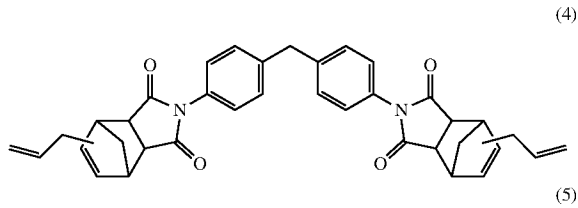

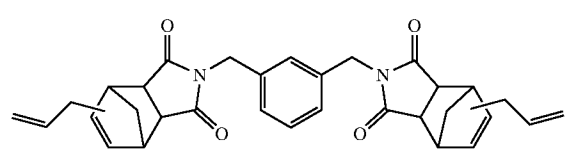

In the resin composition of the present embodiment, the content of the alkenyl-substituted nadimide is preferably determined according to the ratio of the number of functional group between an alkenyl group, one of its functional groups, and a maleimide group in the maleimide compound as mentioned later. The content of the alkenyl-substituted nadimide is preferably 20 to 50 parts by mass, more preferably 25 to 45 parts by mass, based on 100 parts by mass in total of component(s) constituting a resin in the resin composition. When the content of the alkenyl-substituted nadimide falls within such a range, the resulting resin composition or the like can be excellent in moldability even when filled with an inorganic filler, and be excellent in curability and elastic modulus under heat during curing, and a printed circuit board or the like excellent in desmear resistance and chemical resistance can be obtained.

In the resin composition of the present embodiment, the contents of the alkenyl-substituted nadimide and the maleimide compound are preferably determined by the ratio between the numbers of their respective designated functional groups. In this context, the designated functional group of the alkenyl-substituted nadimide is alkenyl groups bonded to molecular ends, and the designated functional group of the maleimide compound is maleimide groups.

The resin composition of the present embodiment preferably contains the alkenyl-substituted nadimide and the maleimide compound so as to satisfy a relationship represented by the following formula (B), more preferably a relationship represented by the following formula (B1):

$$0.9 \le \beta/\alpha \le 4.3 \tag{B}$$

$$1.5 \le .\beta/\alpha \le 4.0 \tag{B1}$$

In these formulas, a represents the total number of alkenyl groups contained in the alkenyl-substituted nadimide in the resin composition, and β represents the total number of maleimide groups contained in the maleimide compound in the resin composition. When the functional group ratio (β/α) falls within such a range, the resulting resin composition or the like can have a better elastic modulus under heat and easier curability during curing, and a printed circuit board or the like can be obtained which is excellent in low thermal expansion, heat resistance, heat resistance after moisture absorption, desmear resistance, and chemical resistance.

The resin composition of the present embodiment preferably further contains a cyanate ester compound in addition to each component mentioned above. By use of the cyanate ester compound, a resin composition, a prepreg, a resin sheet, a metal foil-clad laminate, and a printed circuit board excellent in moldability can be obtained, and a metal foil-clad laminate and a printed circuit board having better metal foil peel strength can be obtained. The cyanate ester compound is used singly or in combinations of two or more thereof.

Examples of the type of the cyanate ester compound used in the present embodiment include, but are not particularly limited to, a naphthol aralkyl-based cyanate ester represented by the formula (7) set forth below, a novolac-based cyanate ester represented by the formula (8) set forth below, biphenyl aralkyl-based cyanate esters, bis(3,3-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8- dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl) ether, bis(4-cyanatophenyl) thioether, bis(4-cyanatophenyl)sulfone, and 2,2-bis(4-cyanatophenyl)propane.

Among them, a naphthol aralkyl-based cyanate ester represented by the following formula (7), a novolac-based cyanate ester represented by the following formula (8), and a biphenyl aralkyl-based cyanate ester are particularly preferred because of excellent flame retardancy, high curability, and the low coefficient of thermal expansion of a cured product.

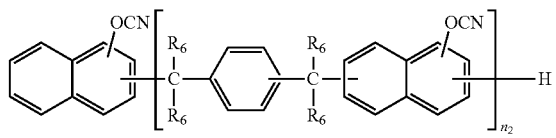

(7)

In this formula, each $R_6$ independently represents a hydrogen atom or a methyl group and is particularly preferably a hydrogen atom. In the formula, $n_2$ represents an integer of 1 or larger. The upper limit of $n_2$ is preferably 10, more preferably 6.

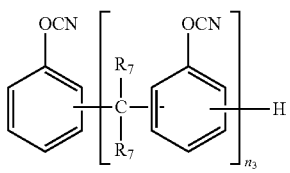

(8)

In this formula, each $R_7$ independently represents a hydrogen atom or a methyl group and is particularly preferably a hydrogen atom. In the formula, $n_3$ represents an integer of 1 or larger. The upper limit of $n_3$ is preferably 10, more preferably 7.

Methods for producing these cyanate ester compounds are not particularly limited, and the cyanate ester compound used in the present embodiment may be produced by any method existing as a cyanate ester synthesis method. As a specific example, the cyanate ester compound can be obtained by reacting a naphthol aralkyl-based phenol resin represented by the formula (9) set forth below with cyanogen halide in the presence of a basic compound in an inert organic solvent. An alternate method that may be adopted involves forming a salt of a similar naphthol aralkyl-based phenol resin and a basic compound in a solution containing water, followed by two-phase interfacial reaction with cyanogen halide for synthesis.

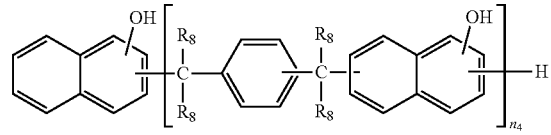

(9)

In this formula, each Re independently represents a hydrogen atom or a methyl group and is particularly preferably a hydrogen atom. In the formula, $n_4$ represents an integer of 1 or larger. The upper limit of $n_4$ is preferably 10, more preferably 6.

The naphthol aralkyl-based cyanate ester can be selected from those obtained by condensing cyanic acid with a naphthol aralkyl resin obtained through the reaction of a naphthol such as α-naphthol or β-naphthol with p-xylylene glycol, α,α'-dimethoxy-p-xylene, 1,4-di(2-hydroxy-2-propyl)benzene, or the like.

In the resin composition of the present embodiment, the content of the cyanate ester compound is not particularly limited and is preferably 0.01 to 40 parts by mass, more preferably 0.01 to 25 parts by mass, based on 100 parts by mass in total of component(s) constituting a resin in the resin composition. When the content of the cyanate ester compound falls within such a range, a resin composition, a prepreg, and a resin sheet having better moldability even with an inorganic filler and having an excellent elastic modulus under heat during curing can be obtained, and a metal foil-clad laminate and a printed circuit board having better desmear resistance and chemical resistance can be obtained.

The resin composition of the present embodiment may be supplemented with a resin other than those mentioned above (hereinafter, also referred to as an "additional resin") without impairing the expected characteristics. The type of the additional resin is not particularly limited as long as the resin has insulating properties. Examples thereof include resins such as epoxy resins, benzoxazine compounds, phenol resins, thermoplastic resins, and silicone resins. Appropriately combined use with these resins can impart metal adhesion to a prepreg and a resin sheet and can impart stress-relaxing properties to a printed circuit board or the like.

The resin composition of the present embodiment may contain a silane compound having a group capable of being chemically bonded to an organic group, and a hydrolyzable group or a hydroxy group (hereinafter, referred to as an "additional silane compound"), except for the styryl silane compound, and/or a wetting dispersant in order to improve the dispersibility of the inorganic filler and the adhesion strength between the resin and the inorganic filler or glass cloth. The additional silane compound is not particularly limited and may be a silane coupling agent generally used in the surface treatment of inorganic substance. Specific examples of the additional silane compound include: aminosilane compounds having an amino group and a hydrolyzable group or a hydroxy group, such as γ-aminopropyltriethoxysilane and N-β-(aminoethyl)-γ-aminopropyltrimethoxysilane; epoxysilane compounds having an epoxy group and a hydrolyzable group or a hydroxy group, such as 3-glycidoxypropyltrimethoxysilane; vinylsilane compounds having a vinyl group and a hydrolyzable group or a hydroxy group, such as γ-methacryloxypropyltrimethoxysilane; and cationic silane coupling agents. These additional silane compounds are used singly or in combinations of two or more thereof.

Among the silane compounds mentioned above, an epoxysilane compound is preferred in view of further enhancing moldability. The epoxysilane compound may be an epoxysilane coupling agent having an epoxy group and a hydrolyzable group or a hydroxy group. Examples thereof include 3-glycidoxypropyltrimethoxysilane, 3-glycidoxypropylmethyldimethoxysilane, 3-glycidoxypropyltriethoxysilane, and 3-glycidoxypropylmethyldiethoxysilane. 3-Glycidoxypropyltrimethoxysilane is preferred.

In the resin composition of the present embodiment, the content of the additional silane compound is not particularly limited and is preferably 0.1 to 15 parts by mass, more preferably 0.5 to 5 parts by mass, based on 100 parts by mass in total of component(s) constituting a resin in the resin composition. When the content of the additional silane compound falls within such a range, a resin composition, a prepreg, and a resin sheet having better moldability even with an inorganic filler and having a better elastic modulus under heat during curing can be obtained, and a metal foil-clad laminate and a printed circuit board having better desmear resistance and chemical resistance can be obtained.

The wetting dispersant is not particularly limited as long as the wetting dispersant is used as a dispersion stabilizer for paint. Examples of commercially available products of the wetting dispersant include Disperbyk-110, 111, 118, 180, 161, 2009, BYK-W996, W9010, and W903 (all are product names) manufactured by BYK Japan K.K. These wetting dispersants are used singly or in combinations of two or more thereof.

The resin composition of the present embodiment may be used in combination with a curing accelerator without impairing expected characteristics. Examples of the curing accelerator include: imidazole compounds; organic peroxides such as benzoyl peroxide, lauroyl peroxide, acetyl peroxide, p-chlorobenzoyl peroxide, and di-tert-butyl-diperphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octoate, tin oleate, dibutyl tin maleate, manganese naphthenate, cobalt naphthenate, and acetyl acetone iron; these organic metal salts dissolved in hydroxy group-containing compounds such as phenol and bisphenol; inorganic metal salts such as tin chloride, zinc chloride, and aluminum chloride; and dioctyl tin oxide and other organic tin compounds such as alkyl tin and alkyl tin oxide. These curing accelerators are used singly or in combinations of two or more thereof.

The resin composition of the present embodiment preferably further contains an imidazole compound among the curing accelerators described above. The imidazole compound is not particularly limited and is preferably an imidazole compound represented by the following formula (11) in view of more effectively and reliably exhibiting the function effects of the present invention.

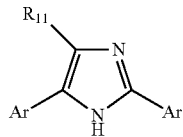

(11)

In this formula, Ar represents a phenyl group, a naphthalene group, a biphenyl group, or an anthracene group, or a monovalent group thereof modified with a hydroxy group and is particularly preferably a phenyl group. $R_{11}$ represents a hydrogen atom, an alkyl group or a monovalent group thereof modified with a hydroxy group, or an aryl group. Examples of the aryl group include a substituted or unsubstituted phenyl group, naphthalene group, biphenyl group, and anthracene group. A phenyl group is preferred. More preferably, both of the Ar group and the $R_{11}$ group are phenyl groups.

Examples of the imidazole compound include 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole, 2,4,5-triphenylimidazole, and 2-phenyl-4-methylimidazole. Among them, 2,4,5-triphenylimidazole or 2-phenyl-4-methylimidazole is more preferred, and 2,4,5-triphenylimidazole is particularly preferred.

In the resin composition of the present embodiment, the content of the imidazole compound is not particularly limited and is preferably 0.01 to 10 parts by mass, more preferably 0.1 to 5 parts by mass, based on 100 parts by mass in total of component(s) constituting a resin in the resin composition. When the content of the imidazole compound falls within such a range, a resin composition, a prepreg, and a resin sheet excellent in curability and moldability, and a metal foil-clad laminate and a printed circuit board from these raw materials can be obtained.

The resin composition of the present embodiment may further contain a surface conditioner for the purpose of, for example, improving the dispersibility of solid material such as the inorganic filler. The surface conditioner is not particularly limited as long as the surface conditioner is a surfactant conventionally contained in resin compositions. Examples thereof include polydimethylsiloxane derivatives and acrylic derivatives. Examples of commercially available products thereof include BYK-310, 330, and 346 manufactured by BYK Japan K.K. These surface conditioners are used singly or in combinations of two or more thereof.

The resin composition of the present embodiment may also contain a solvent, if necessary. For example, use of an organic solvent reduces viscosity during the preparation of the resin composition and thus improves handleability while enhancing the impregnation of glass cloth with the resin composition. The type of the solvent is not particularly limited as long as the solvent is capable of dissolving a portion or the whole of the resins in the resin composition. Specific examples thereof include, but are not particularly limited to: ketones such as acetone, methyl ethyl ketone, and methylcellosolve; aromatic hydrocarbons such as toluene and xylene; amides such as dimethylformamide; and propylene glycol monomethyl ether and its acetate. These solvents are used singly or in combinations of two or more thereof.

The resin composition of the present embodiment can be prepared in accordance with an ordinary method. For example, a preferred method involves obtaining a resin composition homogeneously containing the components mentioned above. Specifically, for example, the components mentioned above can be sequentially added to the solvent and sufficiently stirred to readily prepare the resin composition of the present embodiment. The styryl silane compound may be contained in the resin composition, as with other components. Alternatively or additionally to this, the inorganic filler may be surface-treated with the styryl silane compound, and the inorganic filler bonded at its surface to the styryl silane compound can then be mixed with other components to prepare the resin composition. The method for surface-treating the inorganic filler with the styryl silane compound is not particularly limited. Examples thereof include direct treatment methods such as a dry treatment method and a treatment method using slurry (wet method).

A wet method is preferred in view of uniform treatment. Alternatively, a commercially available surface-treated inorganic filler (filler) may be used.

An organic solvent may be used, if necessary, in the preparation of the resin composition of the present embodiment. The type of the organic solvent is not particularly limited as long as the solvent is capable of dissolving the resins in the resin composition. Specific examples thereof are as listed above. Treatment (stirring, mixing, or kneading treatment, etc.) known in the art for uniformly dissolving or dispersing each component can be carried out in the preparation of the resin composition. In the case of using, for example, the inorganic filler, the inorganic filler can be uniformly dispersed by stirring and dispersion treatment using a stirring vessel equipped with a stirrer having an appropriate stirring ability. This enhances the dispersibility of the inorganic filler (D) in the resin composition. The stirring, mixing, or kneading treatment can be appropriately performed by using an apparatus known in the art such as an apparatus aimed at mixing such as a ball mill or a bead mill, or a revolution- or rotation-type mixing apparatus.

The prepreg of the present embodiment is a prepreg including a base material and the resin composition, the base material being impregnated or coated with the resin composition. The method for producing the prepreg can be carried out in accordance with an ordinary method without particular limitations. For example, the base material can be impregnated or coated with the resin components according to the present embodiment, followed by semi-curing (B-staging) by heating or the like for 1 to 30 minutes in a drier of 100 to 200° C. to prepare the prepreg of the present embodiment.

The content of the resin composition (containing the inorganic filler) is not particularly limited and is preferably 30 to 90% by mass, more preferably 35 to 85% by mass, further preferably 40 to 80% by mass, based on the total mass of the prepreg. When the content of the resin composition falls within the range described above, moldability tends to be further improved.

The base material is not particularly limited and can be appropriately selected for use from various printed circuit board materials known in the art according to the intended use or performance. Specific examples thereof include, but are not particularly limited to: glass fibers such as E glass, D glass, S glass, Q glass, spherical glass, NE glass, L glass, and T glass; non-glass inorganic fibers such as quartz; wholly aromatic polyamides such as poly-p-phenyleneterephthalamide (Kevlar®, manufactured by Du Pont K.K.) and co-poly-p-phenylene/3,4'-oxydiphenylene/terephthalamide (Technora®, manufactured by Teijin Techno Products, Ltd.); polyesters such as 2,6-hydroxynaphthoic acid/p-hydroxybenzoic acid (Vectran®, manufactured by Kuraray Co., Ltd.) and Zexion® (manufactured by KB Seiren, Ltd.); and organic fibers such as poly-p-phenylene benzoxazole (Zylon®, manufactured by Toyobo Co., Ltd.) and polyimide. Among them, E glass, T glass, S glass, Q glass, or an organic fiber is preferred in view of a low coefficient of thermal expansion. These base materials may be used singly or in combinations of two or more thereof.

Examples of the form of the base material include, but are not particularly limited to, woven fabrics, nonwoven fabrics, lobings, chopped strand mats, and surfacing mats. The textures of the woven fabrics are not particularly limited, and, for example, plain weave, mat weave, and twill weave are known. The base material can be appropriately selected for use from these materials known in the art according to the intended use or performance. Such a base material subjected to opening treatment or a glass woven fabric surface-treated with a silane compound (e.g., a silane coupling agent) or the like is preferably used. The base material is not particularly limited by its thickness and mass. Usually, the thickness of the base material of approximately 0.01 to 0.3 mm is preferably used. In particular, the base material is preferably a glass woven fabric having a thickness of 200 m or smaller and a mass of 250 g/m$^2$ or smaller, more preferably a woven fabric (cloth) made of one or more fibers selected from the group consisting of E glass, S glass, T glass, and Q glass fibers, and an organic fiber in view of strength and water absorbability.

The resin sheet of the present embodiment includes a support (sheet base material) and the resin composition, the sheet base material being coated with the resin composition. The resin composition is laminated on one side or both sides of the sheet base material. The resin sheet is used as an approach for thinning and can be produced, for example, by directly coating a support such as a metal foil or a film with a thermosetting resin (containing an inorganic filler) for use in prepregs, etc., followed by drying.

The sheet base material is not particularly limited, and any of various printed circuit board materials known in the art can be used. Examples thereof include polyimide films, polyamide films, polyester films, polyethylene terephthalate (PET) films, polybutylene terephthalate (PBT) films, polypropylene (PP) films, polyethylene (PE) films, aluminum foils, copper foils, and gold foils. Among them, an electrolytic copper foil or a PET film is preferred.

Examples of the coating method include a method of applying a solution containing the resin composition of the present embodiment dissolved in a solvent onto the sheet base material using a bar coater, a die coater, a doctor blade, a Baker applicator, or the like.

The resin sheet is preferably a product obtained by coating the support (sheet base material) with the resin composition, followed by semi-curing (B-staging) the resin composition. Specific examples thereof include a method which involves coating the sheet base material such as a copper foil with the resin composition, followed by semi-curing the resin composition by a method such as heating for 1 to 60 minutes in a drier of 100 to 200° C. to produce the resin sheet. The amount of the resin composition applied to the support is preferably in the range of 1 to 300 μm in terms of the resin thickness of the resin sheet. The resin sheet of the present embodiment can be used as a buildup material for printed circuit boards.

The laminate of the present embodiment has one or more layers of at least one material selected from the group consisting of the aforementioned prepreg and resin sheet and includes a cured product of the resin composition contained in at least one material selected from the group consisting of the aforementioned prepreg and resin sheet. This laminate can be obtained by curing one or more layers of at least one material selected from the group consisting of the aforementioned prepreg and resin sheet. The metal foil-clad laminate of the present embodiment is a metal foil-clad laminate having at least one material selected from the group consisting of the aforementioned prepreg and resin sheet, and a metal foil disposed on one side or both sides of at least one material selected from the group consisting of the aforementioned prepreg and resin sheet, the metal foil-clad laminate including a cured product of the resin composition contained in at least one material selected from the group consisting of the aforementioned prepreg and resin sheet. This metal foil-clad laminate can be obtained by providing one or more layers of at least one material selected from the group consisting of the aforementioned prepreg and resin sheet, and disposing the metal foil on one side or both sides thereof, followed by laminate molding. More specifically, the metal foil-clad laminate can be produced by laminating one or more layers of the aforementioned prepreg and/or resin sheet, disposing the metal (e.g., copper or aluminum) foil on one side or both sides thereof if desired, and carrying out laminate molding of this structure according to the need. In this context, the metal foil used is not particularly limited as long as the metal foil can be used as a printed circuit board material. A copper foil known in the art such as a rolled copper foil or an electrolytic copper foil is preferred. The thickness of the metal foil is not particularly limited and is preferably 1 to 70 μm, more preferably 1.5 to 35 μm. The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm² in terms of surface pressure for a heating time in the range of 0.05 to 5 hours. If necessary, post curing may be further carried out at a temperature of 150 to 300° C. Alternatively, the laminate molding of the prepreg mentioned above may be carried out in combination with a separately prepared wiring board for an inner layer to obtain a multilayer board.

The printed circuit board of the present embodiment is a printed circuit board including an insulating layer and a conductor layer formed on the surface of the insulating layer, wherein the insulating layer contains the resin composition mentioned above. The conductor layer that serves as a circuit can be formed from the metal foil in the metal foil-clad laminate mentioned above or can be formed by electroless plating on the insulating layer. This printed circuit board is excellent in chemical resistance, desmear resistance, and insulation reliability and can be particularly effectively used as a printed circuit board for semiconductor packages required to have such performance.

Specifically, the printed circuit board of the present embodiment can be produced by, for example, the following method: first, the metal foil-clad laminate (copper-clad laminate, etc.) mentioned above is prepared. The surface of the metal foil-clad laminate is subjected to etching treatment for the formation of an inner layer circuit to prepare an inner layer substrate. The inner layer circuit surface of this inner layer substrate is subjected, if necessary, to surface treatment for enhancing adhesion strength. Subsequently, a required number of the prepreg mentioned above is laminated on the resulting inner layer circuit surface. A metal foil for an outer layer circuit is laterally laminated thereon, followed by integral molding under heat and pressure. In this way, a multilayer laminate is produced in which the insulating layer composed of the base material and a cured product of thermosetting resin composition is formed between the inner layer circuit and the metal foil for an outer layer circuit. Subsequently, this multilayer laminate is subjected to hole-making processing for making through-holes or via holes and then subjected to desmear treatment for removing smear, which is a residue of resins derived from the resin components contained in the cured product layer. Then, the inside walls of these holes are coated with a metal plating film for conducting the inner layer circuit and the metal foil for an outer layer circuit. The metal foil for an outer layer circuit is further subjected to etching treatment for the formation of the outer layer circuit to produce the printed circuit board.

For example, the prepreg mentioned above (base material impregnated with the resin composition mentioned above) or the resin composition layer of the metal foil-clad laminate (layer composed of the resin composition mentioned above) constitutes the insulating layer including the resin composition mentioned above.

In the present embodiment, the ratio of the flexural modulus at 250° C. to the flexural modulus at 25° C. (hereinafter, referred to as the "rate of elastic modulus maintenance") of the insulating layer is preferably 80 to 100% because warpage caused by the heating of the printed circuit board can be suppressed. Examples of an approach for adjusting the rate of elastic modulus maintenance to 80 to 100% include, but are not particularly limited to, appropriately adjusting the type and content of each component of the resin composition for use in the insulating layer within the ranges described above. The rate of elastic modulus maintenance is specifically determined by the following method: the flexural modulus (bending strength) is measured at each of 25° C. and 250° C. using an autograph according to a method specified by JIS C 6481. From the measured flexural modulus at 25° C. (a) and flexural modulus under heat at 250° C. (b), the rate of elastic modulus maintenance is calculated according to the following formula:

$$\text{Rate of elastic modulus maintenance} = (b)/(a) \times 100$$

Alternatively or additionally to this approach, the rate of elastic modulus maintenance may be adjusted to 80 to 100% by use of an existing method as long as it does nor hinder the object of the present invention. Examples thereof include restricting molecular motion by the introduction of nanofiller, hybridizing nanosilica by a sol-gel method to a cross-linking point in a resin for use in the insulating layer, achieving high Tg of a resin itself for use in the insulating layer, and rendering the resin Tg-less in a region of 400° C. or lower.

When the metal foil-clad laminate is not used, the printed circuit board may be prepared by forming the conductor layer that serves as a circuit on the prepreg or the resin sheet. In this case, an electroless plating approach may be used for forming the conductor layer.

The printed circuit board of the present embodiment can be particularly effectively used as a printed circuit board for semiconductor packages, because the insulating layer mentioned above maintains the excellent elastic modulus even at a reflow temperature during semiconductor packaging and thereby effectively suppresses the warpage of semiconductor plastic packages.

EXAMPLES

Hereinafter, the present invention will be described in more detail with reference to Examples. However, the present invention is not intended to be limited by these Examples.

(Synthesis Example 1) Synthesis of α-Naphthol Aralkyl-Based Cyanate Ester Resin

A reactor equipped with a thermometer, a stirrer, a dropping funnel, and a reflux condenser was cooled to 0 to 5° C. in advance using brine and charged with 7.47 g (0.122 mol) of cyanogen chloride, 9.75 g (0.0935 mol) of 35% hydrochloric acid, 76 mL of water, and 44 mL of methylene chloride. While the temperature and pH of this reactor were kept at −5 to +5° C. and 1 or lower, respectively, a solution containing 20 g (0.0935 mol) of an α-naphthol aralkyl-based phenol resin of the formula (9) wherein all of the Re were hydrogen atoms (SN485, OH group equivalent: 214 g/eq., softening point: 86° C., manufactured by Nippon Steel & Sumikin Chemical Co., Ltd.), and 14.16 g (0.14 mol) of triethylamine dissolved in 92 mL of methylene chloride was added dropwise over 1 hour through the dropping funnel with stirring. After the completion of the dropwise addition, 4.72 g (0.047 mol) of triethylamine was further added dropwise thereto over 15 minutes. After the completion of the dropwise addition, the mixture was stirred at the same temperature as above for 15 minutes. Then, the reaction solution was separated into organic and aqueous layers, and the organic layer was separated. The obtained organic layer was washed with 100 mL of water twice. Then, methylene chloride was distilled off under reduced pressure with an evaporator, and the residue was finally concentrated to dryness at 80° C. for 1 hour to obtain 23.5 g of a cyanate ester product of the α-naphthol aralkyl-based phenol resin (α-naphthol aralkyl-based cyanate ester resin, functional group equivalent: 261 g/eq.).

Example 1

10 parts by mass of the α-naphthol aralkyl-based cyanate ester resin obtained by Synthesis Example 1, 45 parts by mass of a novolac-based maleimide compound (BMI-2300, manufactured by Daiwa Fine Chemicals Co., Ltd., functional group equivalent: 186 g/eq.), and 45 parts by mass of bisallylnadimide (BANI-M, manufactured by Maruzen Petrochemical Co., Ltd., functional group equivalent: 286 g/eq.) were mixed with 150 parts by mass of spherical silica (SC-5050MOB, particle size: 1.6 μm, manufactured by Admatechs Co., Ltd.), 2.5 parts by mass of an epoxysilane compound 3-glycidoxypropyltrimethoxysilane (KBM-403, manufactured by Shin-Etsu Chemical Co., Ltd.), 2.5 parts by mass of a styryl silane compound p-styryltrimethoxysilane (KBM-1403, manufactured by Shin-Etsu Chemical Co., Ltd.), and 1 part by mass of a wetting dispersant (DIS-PERBYK-161, manufactured by BYK Japan K.K.), and the mixture was diluted with methyl ethyl ketone to obtain varnish. An E glass woven fabric was impregnated and coated with this varnish, and dried by heating at 160° C. for 3 minutes to obtain a prepreg having a resin composition content of 49% by mass. In this respect, the ratio [β/α] was 1.54. In this context, the ratio [β/α] is represented by the following formula (the same holds true for the description below):

[β/α]=(Parts by mass of the maleimide compound/
Functional group equivalent of the maleimide
compound)/(Parts by mass of the alkenyl-substi-
tuted nadimide/Functional group equivalent of
the alkenyl-substituted nadimide)

Example 2

Varnish was obtained in the same way as in Example 1, and a prepreg was obtained in the same way as in Example 1, except that 5 parts by mass of the styryl silane compound p-styryltrimethoxysilane (KBM-1403, manufactured by Shin-Etsu Chemical Co., Ltd. were used instead of 2.5 parts by mass of the epoxysilane compound 3-glycidoxypropyltrimethoxysilane (KBM-403, manufactured by Shin-Etsu Chemical Co., Ltd.) and 2.5 parts by mass of the styryl silane compound p-styryltrimethoxysilane (KBM-1403, manufactured by Shin-Etsu Chemical Co., Ltd.).

Comparative Example 1

Varnish was obtained in the same way as in Example 1, and a prepreg was obtained in the same way as in Example 1, except that 5 parts by mass of the epoxysilane compound 3-glycidoxypropyltrimethoxysilane (KBM-403, manufactured by Shin-Etsu Chemical Co., Ltd.) were used instead of 2.5 parts by mass of the epoxysilane compound 3-glycidoxypropyltrimethoxysilane (KBM-403, manufactured by Shin-Etsu Chemical Co., Ltd.) and 2.5 parts by mass of the styryl silane compound p-styryltrimethoxysilane (KBM-1403, manufactured by Shin-Etsu Chemical Co., Ltd.).

Comparative Example 2

Varnish was obtained in the same way as in Example 1, and a prepreg was obtained in the same way as in Example 1, except that 5 parts by mass of an acrylic silane compound 3-acryloxypropyltrimethoxysilane (KBM-5103, manufactured by Shin-Etsu Chemical Co., Ltd.) were used instead of 2.5 parts by mass of the epoxysilane compound 3-glycidoxypropyltrimethoxysilane (KBM-403, manufactured by Shin-Etsu Chemical Co., Ltd.) and 2.5 parts by mass of the styryl silane compound p-styryltrimethoxysilane (KBM-1403, manufactured by Shin-Etsu Chemical Co., Ltd.).

Comparative Example 3

Varnish was obtained in the same way as in Example 1, and a prepreg was obtained in the same way as in Example 1, except that 2.5 parts by mass of the epoxysilane compound 3-glycidoxypropyltrimethoxysilane (KBM-403, manufactured by Shin-Etsu Chemical Co., Ltd.) and 2.5 parts by mass of an acrylic silane compound 3-acryloxypropyltrimethoxysilane (KBM-5103, manufactured by Shin-Etsu Chemical Co., Ltd.) were used instead of 2.5 parts by mass of the epoxysilane compound 3-glycidoxypropyltrimethoxysilane (KBM-403, manufactured by Shin-Etsu Chemical Co., Ltd.) and 2.5 parts by mass of the styryl silane compound p-styryltrimethoxysilane (KBM-1403, manufactured by Shin-Etsu Chemical Co., Ltd.).

Comparative Example 4

Varnish was obtained in the same way as in Example 1, and a prepreg was obtained in the same way as in Example 1, except that 5 parts by mass of an olefin silane compound octenyltrimethoxysilane (KBM-1083, manufactured by Shin-Etsu Chemical Co., Ltd.) were used instead of 2.5 parts by mass of the epoxysilane compound 3-glycidoxypropyltrimethoxysilane (KBM-403, manufactured by Shin-Etsu Chemical Co., Ltd.) and 2.5 parts by mass of the styryl silane compound p-styryltrimethoxysilane (KBM-1403, manufactured by Shin-Etsu Chemical Co., Ltd.).

Comparative Example 5

Varnish was obtained in the same way as in Example 1, and a prepreg was obtained in the same way as in Example 1, except that 5 parts by mass of an acrylic silane compound methacryloxyoctyltrimethoxysilane (KBM-5803, manufactured by Shin-Etsu Chemical Co., Ltd.) were used instead of 2.5 parts by mass of the epoxysilane compound 3-glycidoxypropyltrimethoxysilane (KBM-403, manufactured by Shin-Etsu Chemical Co., Ltd.) and 2.5 parts by mass of the styryl silane compound p-styryltrimethoxysilane (KBM-1403, manufactured by Shin-Etsu Chemical Co., Ltd.).

[Preparation of Metal Foil-Clad Laminate]

Electrolytic copper foils having a thickness of 12 μm (3EC-III, manufactured by Mitsui Mining & Smelting Co., Ltd.) were disposed on the upper and lower sides of 1 layer, 4 layers, or 8 layers of the prepreg thus obtained, and laminate molding of the resultant was carried out at a pressure of 30 kgf/cm$^2$ and a temperature of 220° C. for 120 minutes to obtain a copper-clad laminate having an insulating layer thickness of 0.1 mm, 0.4 mm, or 0.8 mm as a metal foil-clad laminate.

[Insulation Reliability]

The insulation reliability was evaluated by the interwinding insulation reliability test based on HAST (highly accelerated temperature and humidity stress test). First, a printed circuit board (L/S=100/100 μm) was formed by the subtractive method from the copper-clad laminate (thickness: 0.1 mm) thus obtained. Next, a power was connected to the wiring, and continuous humidity insulation resistance was evaluated under conditions involving a temperature of 130° C., a humidity of 85%, and an applied voltage of 5 VDC. A resistance value equal to or lower than $1.0\times10^8\Omega$ was regarded as a breakdown. The evaluation criteria are as described below.

◯: No breakdown occurred for 500 hours or longer
X: A breakdown occurred in less than 500 hours.

The results are shown in Table 1.

[Chemical Resistance]

The copper-clad laminate (50 mm×50 mm×0.4 mm) was dipped for 2 hours in an aqueous sodium hydroxide solution of 70° C. adjusted to 1 N. The amount of decrease in weight (% by mass) was calculated from the masses of the copper-clad laminate before and after the dipping. A lower absolute value means better chemical resistance (alkali resistance). The results are shown in Table 1.

[Desmear Resistance]

The copper foils were removed from both sides of the copper-clad laminate (50 mm×50 mm×0.4 mm) by etching. The resulting sample was dipped in Swelling Dip Securiganth P manufactured by Atotech Japan K.K. as a swelling solution at 80° C. for 10 minutes, then dipped in Concentrate Compact CP manufactured by Atotech Japan K.K. as a roughening solution at 80° C. for 5 minutes, and finally dipped in Reduction Conditioner Securiganth P500 manufactured by Atotech Japan K.K. as a neutralizing solution at 45° C. for 10 minutes. This treatment was repetitively carried out three times. Then, the amount of decrease in mass (% by mass) was determined from the masses of the copper-clad laminate before and after the treatment. A lower absolute value means better desmear resistance. The results are shown in Table 1.

[Rate of Elastic Modulus Maintenance]

The copper foils were removed from both sides of the copper-clad laminate (50 mm×25 mm×0.8 mm). The flexural modulus of the resulting sample was measured at each of 25° C. and 250° C. using an autograph (AG-Xplus manufactured by Shimadzu Corp.) according to JIS C6481. From the flexural modulus at 25° C. (a) and the flexural modulus at 250° C. (b) measured by this approach, the rate of elastic modulus maintenance was calculated according to the following formula:

Rate of elastic modulus maintenance=$(b)/(a)\times100$

[Heat Resistance]

The copper-clad laminate (50 mm×25 mm×0.4 mm) was floated on solder of 280° C. for 30 minutes, and the presence or absence of delamination was visually confirmed to evaluate heat resistance. The evaluation criteria are as described below.

◯: No abnormalities.
x: Delamination occurred while the sample was floated for 0 to 30 minutes.

TABLE 1

|  | Example 1 | Example 2 | Comparative Example 1 | Comparative Example 2 | Comparative Example 3 | Comparative Example 4 | Comparative Example 5 |
| --- | --- | --- | --- | --- | --- | --- | --- |
| Insulation reliability | ◯ | ◯ | X | ◯ | ◯ | X | X |
| Chemical resistance (% by mass) | −0.45 | −0.59 | −0.63 | −1.48 | −0.17 | −1.31 | −1.72 |
| Desmear resistance (% by mass) | −0.77 | −0.83 | −1.34 | −1.23 | −1.17 | −2.17 | −1.34 |
| Rate of elastic modulus maintenance (%) | 91 | 88 | 93 | 92 | 93 | 88 | 88 |
| Heat resistance | ◯ | ◯ | ◯ | ◯ | ◯ | ◯ | ◯ |

The present application is based on Japanese Patent Application No. 2015-135212 filed on Jul. 6, 2015, the contents of which are incorporated herein by reference.

INDUSTRIAL APPLICABILITY

The present invention can provide an insulating layer for printed circuit boards not only excellent in chemical resistance, desmear resistance, and insulation reliability but excellent in heat resistance and the rate of elastic modulus loss, and is therefore industrially applicable to fields such as printed circuit boards for use in semiconductor plastic packages.

The invention claimed is:

1. A resin composition, comprising:
   a maleimide compound,
   a cyanate ester compound, the content of the cyanate ester compound is 0.01 to 40 parts by mass based on 100 parts by mass in total of resins and components that form resins by polymerization in the resin composition, a silane compound having a styrene skeleton and a hydrolyzable group or a hydroxy group, and
an inorganic filler,
wherein the cyanate ester compound comprises a compound represented by the following formula (7):

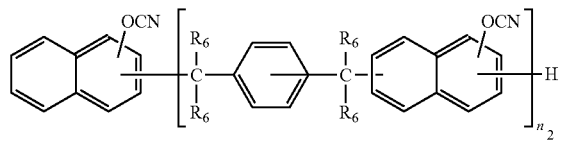

(7)

wherein:
each $R_6$ independently represents a hydrogen atom or a methyl group, and
$n_2$ represents an integer of 1 or larger.

2. The resin composition according to claim 1, wherein the resin composition comprises, as the silane compound, a compound represented by the following formula (A):

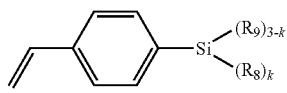

(A)

wherein:
$R_8$ represents the hydrolyzable group or the hydroxy group;
$R_9$ represents a hydrogen atom or an alkyl group having 1 to 3 carbon atoms;
when a plurality of $R_8$ or $R_9$ are present, the plurality of $R_8$ or $R_9$ are the same as or different from each other; and
k represents an integer of 1 to 3.

3. The resin composition according to claim 1, wherein the resin composition comprises, as the maleimide compound, at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the following formula (6):

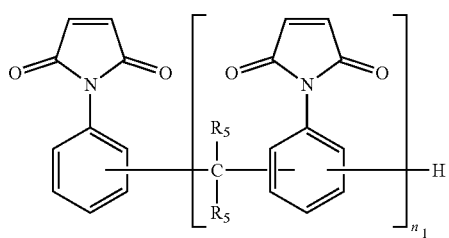

(6)

wherein:
each $R_5$ independently represents a hydrogen atom or a methyl group, and
$n_1$ represents an integer of 1 or larger.

4. The resin composition according to claim 1, wherein the inorganic filler is surface-treated in advance with the silane compound.

5. The resin composition according to claim 1, wherein the content of the silane compound is 0.1 to 15 parts by mass based on 100 parts by mass in total of resins and components that form resins by polymerization in the resin composition.

6. The resin composition claim 1, wherein the inorganic filler comprises at least one selected from the group consisting of silica, alumina, and aluminum nitride.

7. The resin composition according to claim 1, wherein the content of the inorganic filler is 100 to 1100 parts by mass based on 100 parts by mass in total of resins and components that form resins by polymerization in the resin composition.

8. A prepreg comprising a base material and a resin composition according to claim 1, the base material being impregnated or coated with the resin composition.

9. The prepreg according to claim 8, wherein the base material is at least one material selected from the group consisting of E glass cloth, T glass cloth, S glass cloth, Q glass cloth, and an organic fiber cloth.

10. A resin sheet comprising a support and a resin composition according to claim 1, the support being coated with the resin composition.

11. A laminate comprising a cured product of the resin composition according to claim 1, wherein the laminate comprises one or more layers, wherein the one or more layers comprises at least one of:
a prepreg comprising a base material impregnated or coated with the cured product, and
a resin sheet comprising a support coated with the cured product.

12. A metal foil-clad laminate comprising a cured product of the resin composition according to claim 1, wherein the metal foil-clad laminate comprises:
a metal foil disposed on one side or both sides of at least one of:
a prepreg comprising a base material impregnated or coated with the cured product, and
a resin sheet comprising a support coated with the cured product.

13. A printed circuit board comprising an insulating layer and a conductor layer formed on a surface of the insulating layer, wherein the insulating layer comprises a cured product of a resin composition according to claim 1.

* * * * *

UNITED STATES PATENT AND TRADEMARK OFFICE
CERTIFICATE OF CORRECTION

| | |
|---|---|
| PATENT NO. | : 11,769,607 B2 |
| APPLICATION NO. | : 17/527417 |
| DATED | : September 26, 2023 |
| INVENTOR(S) | : Katsuya Tomizawa et al. |

It is certified that error appears in the above-identified patent and that said Letters Patent is hereby corrected as shown below:

In the Claims

Column 24, Line 14 (Claim 6, Line 1), please change "composition claim" to -- composition according to claim --.

Signed and Sealed this
Twenty-seventh Day of August, 2024

Katherine Kelly Vidal
*Director of the United States Patent and Trademark Office*